United States Patent
Liu et al.

(10) Patent No.: US 11,585,703 B2
(45) Date of Patent: Feb. 21, 2023

(54) ON-CHIP TEMPERATURE SENSING WITH NON-VOLATILE MEMORY ELEMENTS

(71) Applicant: GLOBALFOUNDRIES Singapore Pte. Ltd., Singapore (SG)

(72) Inventors: Bin Liu, Singapore (SG); Eng-Huat Toh, Singapore (SG); Shyue Seng Tan, Singapore (SG); Kiok Boone Elgin Quek, Singapore (SG)

(73) Assignee: GlobalFoundries Singapore Pte. Ltd., Singapore (SG)

(*) Notice: Subject to any disclaimer, the term of this patent is extended or adjusted under 35 U.S.C. 154(b) by 529 days.

(21) Appl. No.: 16/700,358

(22) Filed: Dec. 2, 2019

(65) Prior Publication Data
US 2021/0164845 A1    Jun. 3, 2021

(51) Int. Cl.
| | |
|---|---|
| *G01K 7/01* | (2006.01) |
| *G11C 11/406* | (2006.01) |
| *G11C 11/4072* | (2006.01) |
| *G11C 7/04* | (2006.01) |

(52) U.S. Cl.
CPC ............ *G01K 7/01* (2013.01); *G11C 7/04* (2013.01); *G11C 11/4072* (2013.01); *G11C 11/40626* (2013.01); *G01K 2219/00* (2013.01)

(58) Field of Classification Search
CPC ........ G01K 7/01; G01K 7/16; G01K 2219/00; G01K 7/015; G11C 11/40626; G11C 11/4072; G11C 11/1659; G11C 11/1673; G11C 7/04; G11C 13/0004; G11C 13/003; G11C 13/004; G11C 2213/78; G11C 2213/79; H01L 27/0203; H01L 23/5226; H01L 23/5283; G01R 31/2621; G01R 31/27

See application file for complete search history.

(56) References Cited

U.S. PATENT DOCUMENTS

| | | | |
|---|---|---|---|
| 7,882,455 B2 | 2/2011 | Habib et al. | |
| 8,665,635 B2 | 3/2014 | Porter | |
| 9,130,022 B2* | 9/2015 | Wu | .......... H01L 21/76825 |
| 10,288,494 B2 | 5/2019 | Lu et al. | |
| 2010/0220527 A1* | 9/2010 | Norman | ............... G11C 19/287 |
| | | | 365/189.16 |
| 2017/0179382 A1* | 6/2017 | McCollum | .......... G11C 13/0097 |

(Continued)

FOREIGN PATENT DOCUMENTS

| | | | |
|---|---|---|---|
| TW | 201821776 A | 6/2018 | |
| WO | WO-2016080146 A1 * | 5/2016 | .......... G11C 11/1697 |

OTHER PUBLICATIONS

K. Souri, Y. Chae and K. A. A. Makinwa, "A CMOS Temperature Sensor With a Voltage-Calibrated Inaccuracy of ± 0.15C(3) From 55 C to 125 C" in IEEE Journal of Solid-State Circuits, vol. 48, No. 1, pp. 292-301, Jan. 2013.

(Continued)

*Primary Examiner* — Sultana Begum
(74) *Attorney, Agent, or Firm* — Thompson Hine LLP

(57) ABSTRACT

Structures including non-volatile memory elements and methods of forming such structures. The structure includes a first non-volatile memory element, a second non-volatile memory element, and temperature sensing electronics coupled to the first non-volatile memory element and the second non-volatile memory element.

13 Claims, 8 Drawing Sheets

(56) References Cited

U.S. PATENT DOCUMENTS

2017/0256320 A1    9/2017    Lang et al.

OTHER PUBLICATIONS

Sengupta, A., Liyanagedera, C.M., Jung, B. et al., "Magnetic Tunnel Junction as an On-Chip Temperature Sensor", Sci Rep 7, 11764 (2017).

C. Walczyk et al., "Impact of Temperature on the Resistive Switching Behavior of Embedded HfO2-Based RRAM Devices," in IEEE Transactions on Electron Devices, vol. 58, No. 9, pp. 3124-3131, Sep. 2011.

Hung-Ming Chuang, Kong-Beng Thei, Sheng-Fu Tsai and Wen-Chau Liu, "Temperature-dependent characteristics of polysilicon and diffused resistors," in IEEE Transactions on Electron Devices, vol. 50, No. 5, pp. 1413-1415, May 2003.

Misra et al., "On the Resistive Switching and Current Conduction Mechanisms of Amorphous LaGdO3 Films Grown by Pulsed Laser Deposition", ECS Trans. 2013 vol. 53, issue 3, 229-235.

Chen et al., "A CMOS Thermal Sensor and Its Applications in Temperature Adaptive Design", Proceedings of the 7th International Symposium on Quality Electronic Design, pp. 243-248, Mar. 27-29, 2006.

D. Ha, K. Woo, S. Meninger, T. Xanthopoulos, E. Crain and D. Ham, "Time-Domain CMOS Temperature Sensors With Dual Delay-Locked Loops for Microprocessor Thermal Monitoring," in IEEE Transactions on Very Large Scale Integration (VLSI) Systems, vol. 20, No. 9, pp. 1590-1601, Sep. 2012.

Taiwan Intellectual Property Office, Examination Report dated Feb. 11, 2022 in Taiwanese Patent Application No. 109138063; 7 pages.

Taiwan Intellectual Property Office, Examination Report dated Jun. 2, 2022 in Taiwanese Patent Application No. 109138063; 12 pages.

\* cited by examiner

ON-CHIP TEMPERATURE SENSING WITH NON-VOLATILE MEMORY ELEMENTS

BACKGROUND

The present invention relates to integrated circuits and semiconductor device fabrication and, more specifically, to structures including non-volatile memory elements and methods of forming such structures.

On-chip temperature sensors are being developed to provide temperature readings absent off-chip components. One type of on-chip temperature sensor relies on inverters including field-effect transistors formed by complementary-metal-oxide-semiconductor (CMOS) processes. Field-effect transistors formed by CMOS processes may include performance variations arising from process-related variations, such as variations in gate dielectric thickness and channel doping. Because of these performance variations, CMOS temperature sensors require multiple point calibration in order to provide a high sensing accuracy. Another type of on-chip temperature sensor relies on bipolar junction transistors. However, sensors that rely on bipolar junction transistors require high-precision readout circuits.

Improved structures including non-volatile memory elements and methods of forming such structures are needed.

SUMMARY

According to an embodiment of the invention, a structure includes a first non-volatile memory element, a second non-volatile memory element, and temperature sensing electronics coupled to the first non-volatile memory element and the second non-volatile memory element.

According to another embodiment of the invention, a method includes forming a first non-volatile memory element and a second non-volatile memory element disposed on a first metal feature in a first metallization level of an interconnect structure, and forming a second metal feature in a second metallization level of the interconnect structure that is located over the first non-volatile memory element and the second non-volatile memory element. The second metal feature couples the first non-volatile memory element and the second non-volatile memory element with temperature sensing electronics.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
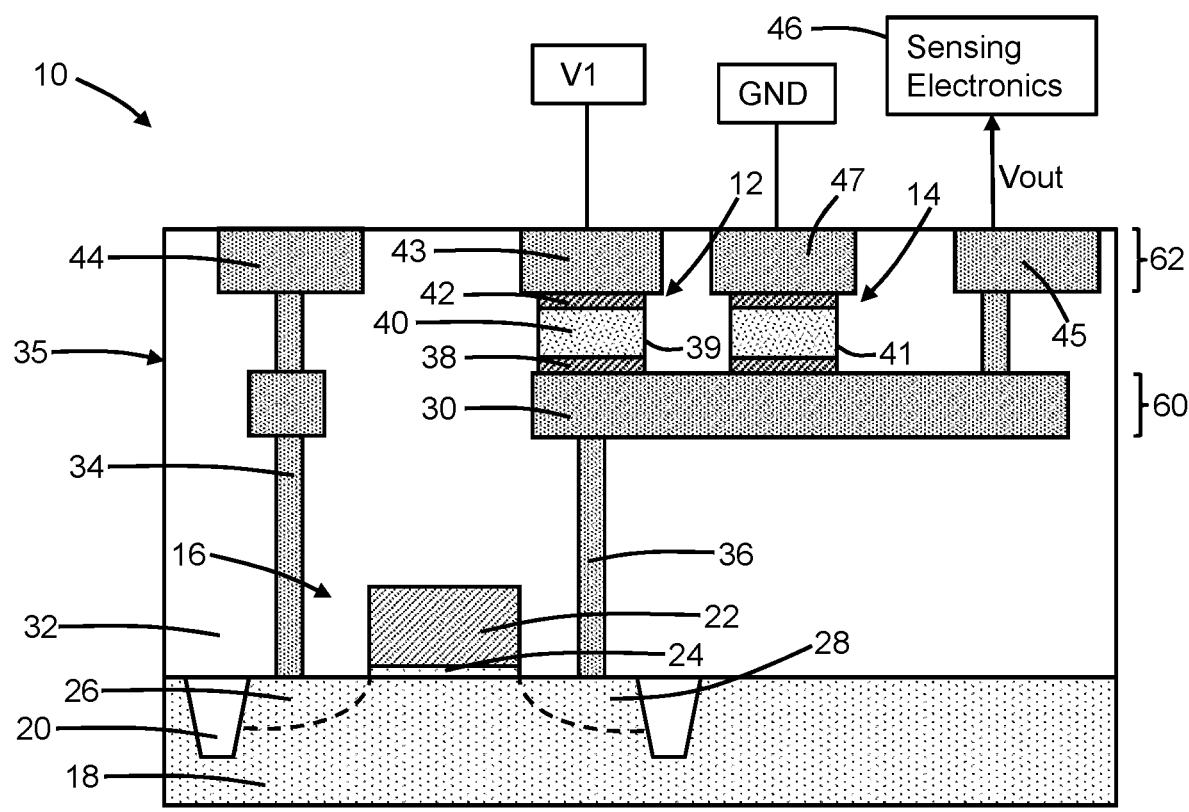
FIG. 1 is a cross-sectional view of a structure for a temperature sensor in accordance with embodiments of the invention.

With reference to FIG. 1 and in accordance with embodiments of the invention, a structure 10 for a temperature sensor includes a non-volatile memory element 12, a non-volatile memory element 14, and a field-effect transistor 16 coupled to the non-volatile memory elements 12, 14. The field-effect transistor 16, which provides an access transistor to the non-volatile memory elements 12, 14, may be fabricated by front-end-of-line (FEOL) processing using a substrate 18 that is composed of a single-crystal semiconductor material, such as single-crystal silicon. Shallow trench isolation regions 20, which may be composed of a dielectric material such as silicon dioxide, may be formed in trenches that are patterned in the substrate 18. The shallow trench isolation regions 20 surround an active region of the substrate 18 in which the field-effect transistor 16 is formed.

The field-effect transistor 16 may include a gate electrode 22, a gate dielectric layer 24, a source region 26, and a drain region 28. The gate electrode 22 may be composed of heavily-doped polysilicon that is deposited as a blanket layer over the substrate 18 and patterned with lithography and etching processes, and the gate dielectric layer 24 may be composed of silicon dioxide. Alternatively, the gate electrode 22 may be a metal gate formed by a gate-first process or a replacement gate process, and the gate dielectric layer 24 may be composed of a high-k dielectric material. The source region 26 and drain region 28 may be doped regions that are located in the substrate 18. The source region 26 and drain region 28 may be doped with an n-type dopant (e.g., phosphorus and/or arsenic) that provides n-type conductivity or, alternatively, may be doped with a p-type dopant (e.g., boron) that provides p-type conductivity. Instead of having the representative planar design, the field-effect transistor 16 may be a fin-type field-effect transistor, a gate-all-around field-effect transistor, etc.

The non-volatile memory elements 12, 14 may be disposed between a lower metallization level 60 and an upper metallization level 62 of an interconnect structure 35 that is fabricated by back-end-of-line processing over the field-effect transistor 16. The interconnect structure 35 includes one or more interlayer dielectric layers 32, a metal feature 30, and interconnections, such as interconnections 34, 36, having one or more metal islands, vias, and/or contacts arranged as metal features in the one or more interlayer dielectric layers 32. The one or more interlayer dielectric layers 32 may be composed of a dielectric material, such as carbon-doped silicon dioxide, and the interconnections 34, 36 may be composed of one or more metals, such as copper, cobalt, tungsten, and/or a metal silicide.

The non-volatile memory elements 12, 14 are positioned over the metal feature 30 in the lower metallization level 60, such as the first (M1) metallization level, of the interconnect structure 35. Each of the non-volatile memory elements 12, 14 includes a bottom electrode 38 located on the metal feature 30 in the lower metallization level 60, a switching layer 40 located on the bottom electrode 38, and a top electrode 42 located on the switching layer 40. The bottom electrode 38 and top electrode 42 may be composed of a metal, such as ruthenium, platinum, titanium nitride, or tantalum nitride. The switching layer 40, which is positioned between the bottom electrode 38 and the top electrode 42, may be composed of a dielectric material, such as silicon dioxide, silicon nitride, or a metal oxide (e.g., magnesium oxide, tantalum oxide, hafnium oxide, titanium oxide, or aluminum oxide).

The layer stack including the bottom electrode 38, switching layer 40, and top electrode 42 of the non-volatile memory element 12 may have a sidewall 39 extending about the layer stack. Similarly, the layer stack including the bottom electrode 38, switching layer 40, and top electrode 42 of the non-volatile memory element 14 may have a sidewall 41 extending about the layer stack. The sidewalls 39, 41 may define respective perimeters that have equal dimensions in a horizontal plane to provide the non-volatile memory elements 12, 14 with equal sizes. Alternatively, the sidewalls 39, 41 may have unequal dimensions in the horizontal plane to provide the non-volatile memory elements 12, 14 with unequal sizes.

The bottom electrode 38 of the non-volatile memory element 12 and the bottom electrode 38 of the non-volatile memory element 14 are both coupled to the metal feature 30, and the metal feature 30 is coupled to the drain region 28 of the field-effect transistor 16 by the interconnection 36. The top electrode 42 of the non-volatile memory element 12 is coupled to a voltage source (V1) by an interconnection and a metal feature 43 in the upper metallization level 62. The top electrode 42 of the non-volatile memory element 14 is coupled to ground (GND) by an interconnection and a metal feature 47 in the upper metallization level 62. A source line 44 is positioned as a metal feature in the upper metallization level 62. The source line 44 is coupled by the interconnection 34 to the source region 26 of the field-effect transistor 16. The metal feature 30 is also coupled to a metal feature 45 in the upper metallization level 62 in order to couple both non-volatile memory elements 12, 14 to the sensing electronics 46. The sensing electronics 46 may include one or more inverters and/or one or more operational amplifiers that may be located on the same chip as the non-volatile memory elements 12, 14 and field-effect transistor 16. The sensing electronics 46 may be configured to convert the output voltage received from the non-volatile memory elements 12, 14 into a temperature value. The gate electrode 22 of the field-effect transistor 16 may function as a word line during the programming of the non-volatile memory element 12.

The non-volatile memory elements 12, 14 of the structure 10 may be resistive memory elements in which the dielectric material of the switching layer 40, which is normally insulating, can be modified to conduct through one or more filaments or conductive paths that are generated by applying a sufficiently high voltage across the switching layer 40. Filaments are created in order to write the low-resistance state, and filaments are destroyed in order to write the high-resistance state.

Figure 1A:
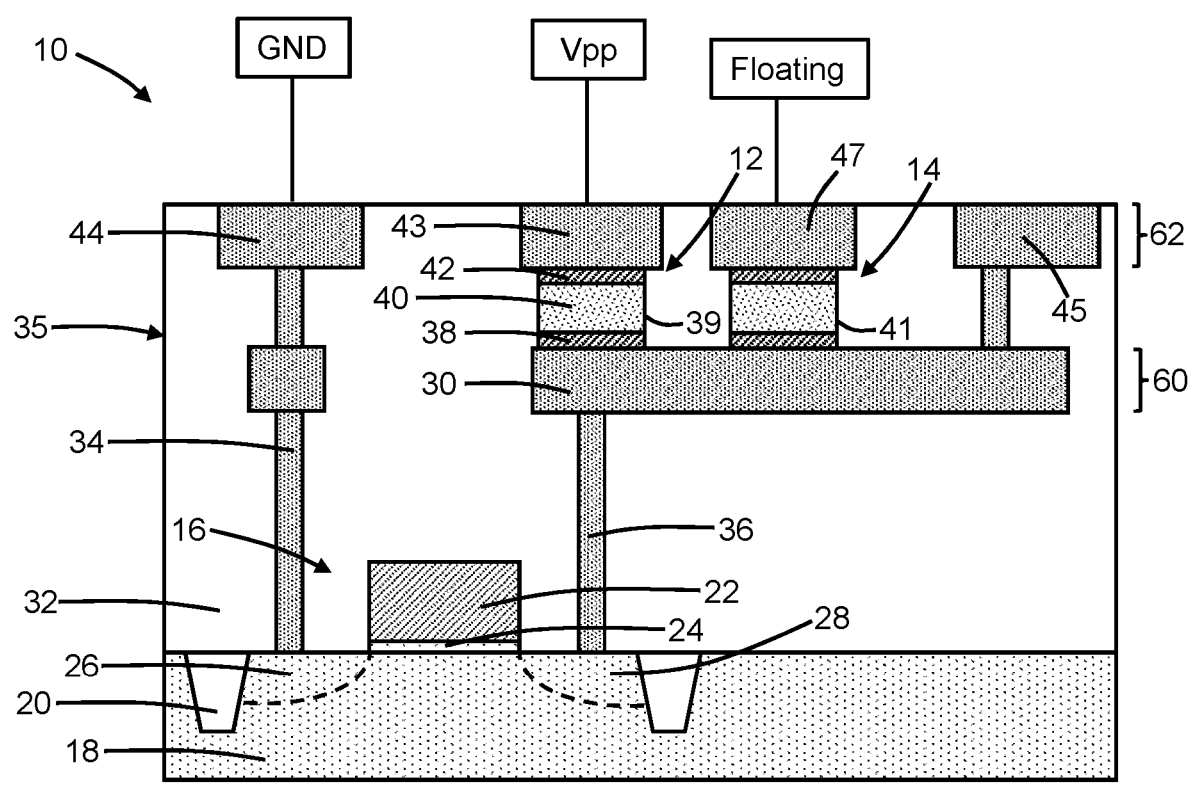
FIG. 1A is a cross-sectional view of the structure of FIG. 1 being programmed in its low-resistance state before use as a temperature sensor.
Figure 1B:
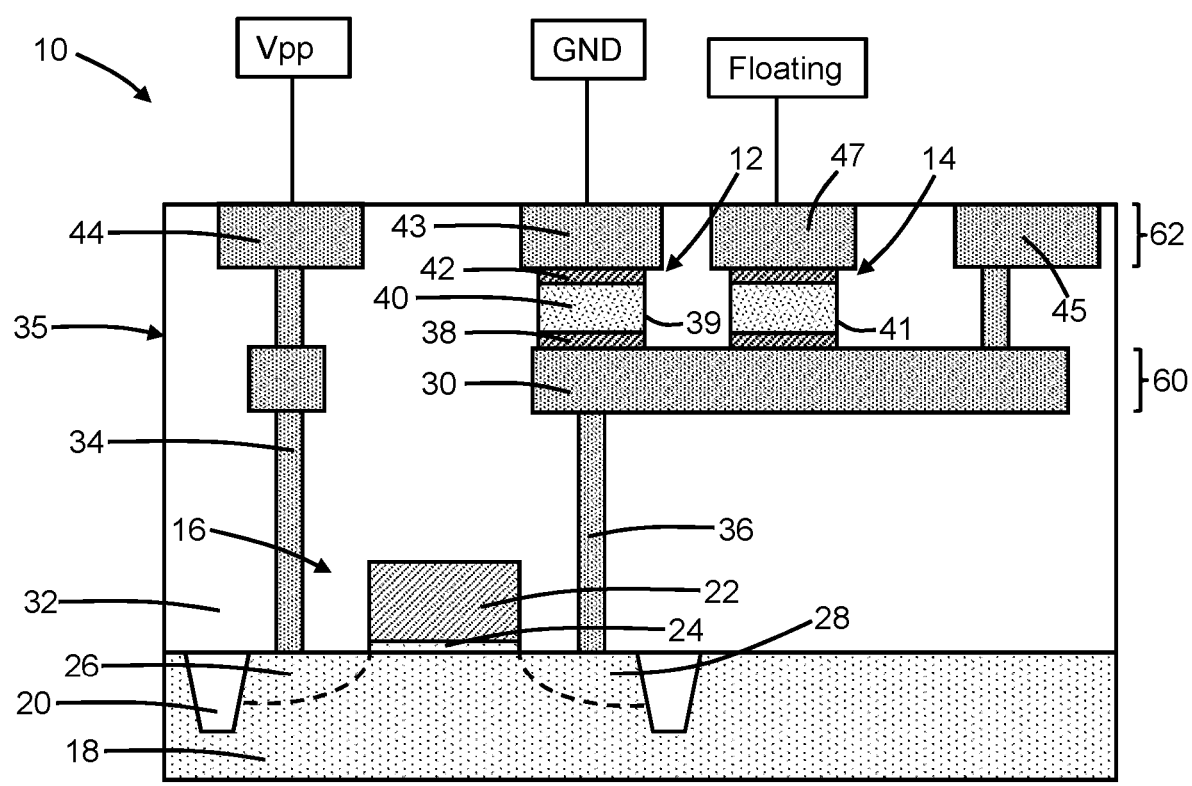
FIG. 1B is a cross-sectional view of the structure of FIG. 1 being programmed in its high-resistance state before use as a temperature sensor.

To prepare the structure 10 to operate as a temperature sensor, the non-volatile memory element 12 is initially written in its low-resistance state, as shown in FIG. 1A, by applying a programming voltage (Vpp) to the non-volatile memory element 12, connecting the source line 44 to ground (GND), allowing the non-volatile memory element 14 to float without connection, and turning on the transistor 16 to supply a programming bias. The non-volatile memory element 12 is subsequently placed in its high-resistance state, as shown in FIG. 1B, by connecting the non-volatile memory element 12 to ground (GND), applying a programming voltage (Vpp) to the source line 44, allowing non-volatile memory element 14 to float without connection, and turning on the transistor 16 to supply a programming current. After placing the non-volatile memory element 12 in its high-resistance state., the non-volatile memory element 12 is maintained in the high-resistance state without further cycling between states.

The non-volatile memory element 14 is unprogrammed and, for that reason, is not cycled to provide either the low-resistance state or the high-resistance state. As a result, the non-volatile memory element 14 and, in particular, its switching layer 40 are in an as-fabricated condition.

In use for sensing temperature and with reference to FIG. 1, the field-effect transistor 16 is turned off, the voltage source (V1) provides a sensing voltage (e.g., 1 volt) to the non-volatile memory element 12, and the non-volatile memory element 14 is coupled to ground. The electrical resistance of the non-volatile memory element 12 exhibits a temperature dependence in its high-resistance state. Similarly, the electrical resistance of the non-volatile memory element 14 also exhibits a temperature dependence in its unprogrammed state. For example, the electrical resistance of each of the non-volatile memory elements 12, 14 may decrease with increasing temperature. However, the variation of the electrical resistance of the non-volatile memory element 14 with temperature over a normal operating temperature range of a host chip may be strong, and the variation of the electrical resistance of the non-volatile memory element 12 with temperature over the normal operating temperature range of the host chip may be weak and exhibit little change. In that regard, the electrical resistance of the non-volatile memory element 14 may exhibit a greater variation in value An output voltage (Vout) is generated by the non-volatile memory elements 12, 14 and is provided from the metal feature 30 to the sensing electronics 46 at which the output voltage may be converted to a temperature reading. The output voltage will vary with temperature primarily because of the temperature dependence of the electrical resistance of the non-volatile memory element 14.

In an alternative embodiment, the non-volatile memory elements 12, 14 may be phase change material (PCM) memory elements that include a phase change material as the switching layer 40. The phase change material may be a chalcogenide glass, such as $Ge_2Sb_2Te_5$, and may be heated to provide an amorphous phase or a crystalline phase that respectively define the high-resistance and low-resistance states. The phase change material may be heated by applying an electrical current that is sufficient to cause melting. Depending on the current magnitude and pulsing of the current, the phase change material can subsequently crystallize or remain amorphous, thereby achieving different resistances and supplying the temperature dependence for the structure 10.

Figure 2:
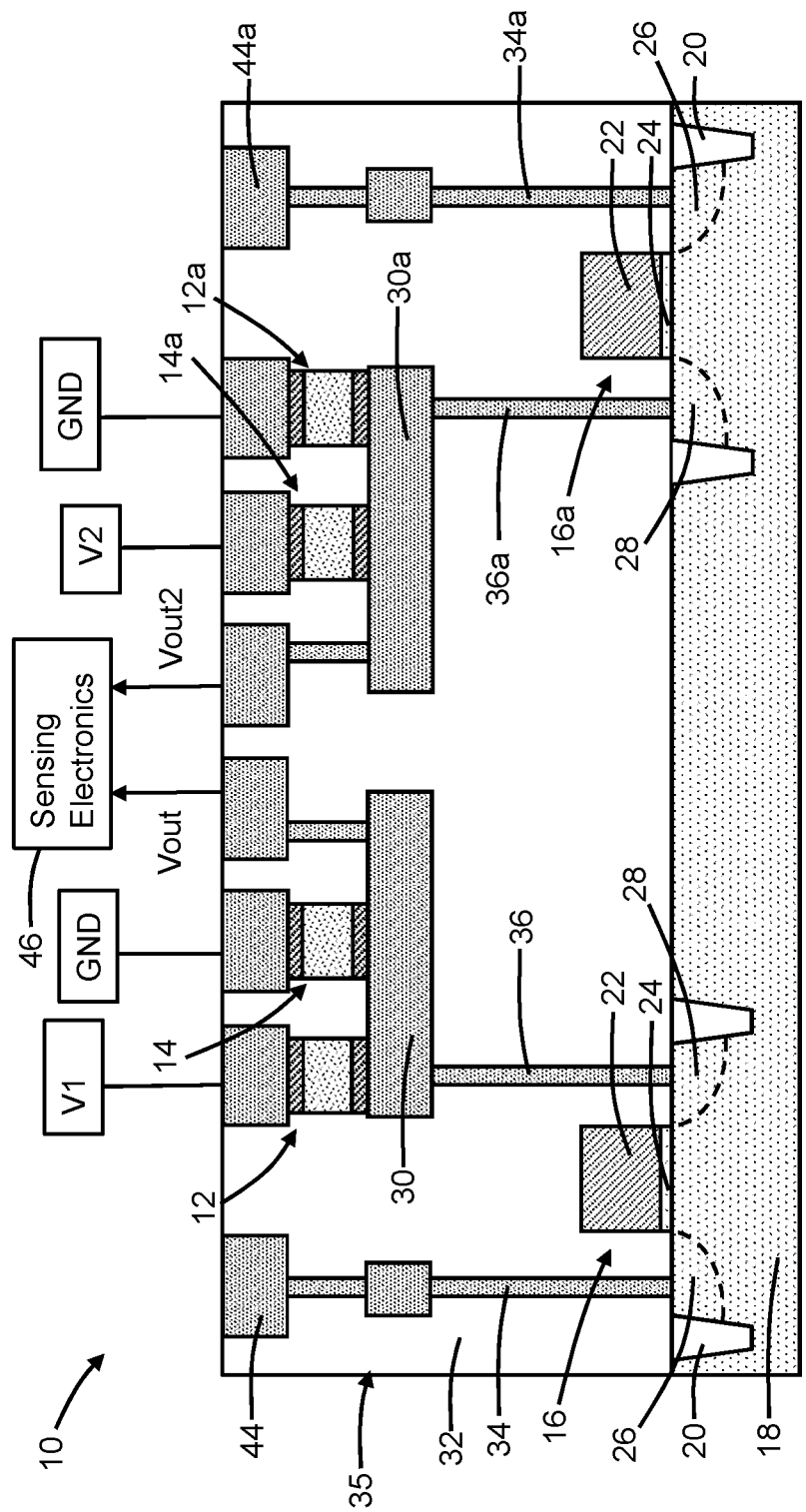
FIG. 2 is a cross-sectional view of a structure for a temperature sensor in accordance with embodiments of the invention.

With reference to FIG. 2 in which like reference numerals refer to like features in FIG. 1 and in accordance with alternative embodiments, the structure 10 for the temperature sensor may be modified to include an additional non-volatile memory element 12a, an additional non-volatile memory element 14a, and an additional field-effect transistor 16a coupled to the non-volatile memory elements 12a, 14a. The non-volatile memory element 12a may be constructed and function identically to the non-volatile memory element 12 as previously described. The non-volatile memory element 14a may be constructed and function identically to the non-volatile memory element 14 as previously described. The field-effect transistor 16a may be constructed and function identically to the field-effect transistor 16 as previously described.

The bottom electrode 38 of the non-volatile memory element 12a and the bottom electrode 38 of the non-volatile memory element 14a are coupled by a metal feature 30a similar to metal feature 30 and an interconnection 36a similar to interconnection 36 to the drain region 28 of the field-effect transistor 16a. The top electrode 42 of the non-volatile memory element 14a is coupled to a voltage source (V2). The top electrode 42 of the non-volatile memory element 12a is coupled to ground. A source line 44a similar to source line 44 is coupled by the interconnection 34a to the source region 26 of the field-effect transistor 16a. The metal feature 30a also couples both non-volatile memory elements 12a, 14a to the sensing electronics 46 independent of the coupling of the non-volatile memory elements 12, 14 to the sensing electronics 46. The gate electrode 22 of the field-effect transistor 16a may function as a word line.

To prepare the structure 10 to operate as a temperature sensor, the non-volatile memory element 12a is initially placed in its low-resistance state by applying a programming voltage to non-volatile memory element 12, connecting the source line 44 to ground, allowing the non-volatile memory element 14a to float without connection, and turning on the transistor 16a to supply a programming bias. The non-volatile memory element 12a is subsequently placed in its high-resistance state by connecting the non-volatile memory element 12a to ground, applying a programming voltage to the source line 44a, allowing the non-volatile memory element 14 to float without connection, and turning on the transistor 16 to supply a programming current. After placing the non-volatile memory element 12a in its high-resistance state, the non-volatile memory element 12a is maintained in the high-resistance state without further cycling between states.

The non-volatile memory element 14a is unprogrammed and, for that reason, is not cycled to provide either the low-resistance state or the high-resistance state. As a result, the non-volatile memory element 14a and, in particular, its switching layer 40 are in an as-fabricated condition.

In use to sense temperature, a sensing voltage is supplied from the voltage source (V2) to the non-volatile memory element 12a, and an output voltage (Vout2) generated by the non-volatile memory elements 12a, 14a is provided from the metal feature 30a to the sensing electronics 46. The sensing electronics 46 converts the combination of the output voltage (Vout) from the non-volatile memory elements 12, 14 and the output voltage (Vout2) from the non-volatile memory elements 12a, 14a to a temperature reading. The temperature sensitivity of the temperature measurement may be effectively increased (e.g., doubled) by the addition of the non-volatile memory elements 12a, 14a, and the field-effect transistor 16a used in their programming, to the structure 10. In embodiments, additional sets of memory elements and field-effect transistors may be added to further increase the temperature sensitivity.

Figure 3:
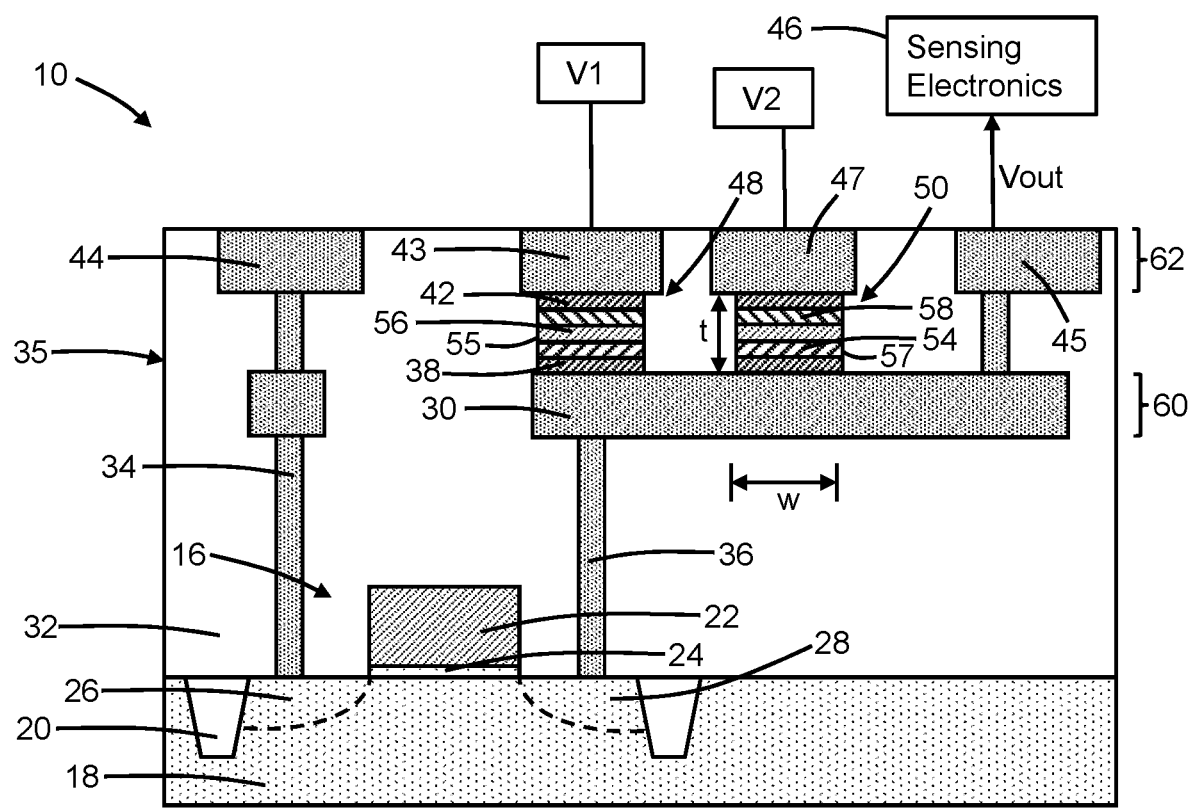
FIG. 3 is a cross-sectional view of a structure for a temperature sensor in accordance with embodiments of the invention.

With reference to FIG. 3 in which like reference numerals refer to like features in FIG. 1 and in accordance with alternative embodiments, the structure 10 may be modified to include non-volatile memory elements 48, 50 that may be constructed as magnetic tunnel junction memory elements.

In that regard, each of the non-volatile memory elements 48, 50 may include a pinned or fixed layer 54, a tunnel barrier layer 56, and a free layer 58 that are arranged in a layer stack between the bottom and top electrodes 38, 42. The fixed layer 54 may include one or more layers, such as a reference layer and a hard layer, that are composed of, for example, a magnetic material, such as a cobalt-platinum alloy or a cobalt-iron-boron alloy. The magnetization of the reference layer of the fixed layer 54 is pinned such that the magnetization cannot flip (i.e., rotate) under the influence of a programming current. The tunnel barrier layer 56 may be composed of a non-magnetic, dielectric material, such as magnesium oxide or aluminum oxide. The free layer 58 may include one or more layers composed of a magnetic alloy, such as a cobalt-iron-boron alloy. The magnetization of the free layer 58 is not pinned such that the magnetization can flip (i.e., rotate) under the influence of a programming current.

The magnetization or magnetic orientation of the reference layer of the fixed layer 54 is pinned to a particular direction while the magnetization or magnetic orientation of the free layer 58 may be switched by a programming current supplied by an applied bias voltage. In particular, the magnetization of the free layer 58 may be switched by the programming current to be aligned in a direction parallel to the magnetization of the reference layer of the fixed layer 54 or switched by the programming current to be aligned in a direction antiparallel to the magnetization of the reference layer of the fixed layer 54. The production of the parallel and antiparallel states depends on the direction of the programming current supplied to each of the non-volatile memory elements 48, 50. Because of increased tunneling across the tunnel barrier layer 56 in the parallel state, the electrical resistance across the tunnel barrier layer 56 between the free layer 58 and the fixed layer 54 in the parallel state is less than the electrical resistance across the tunnel barrier layer 56 between the free layer 58 and the fixed layer 54 in the antiparallel state.

Figure 3A:
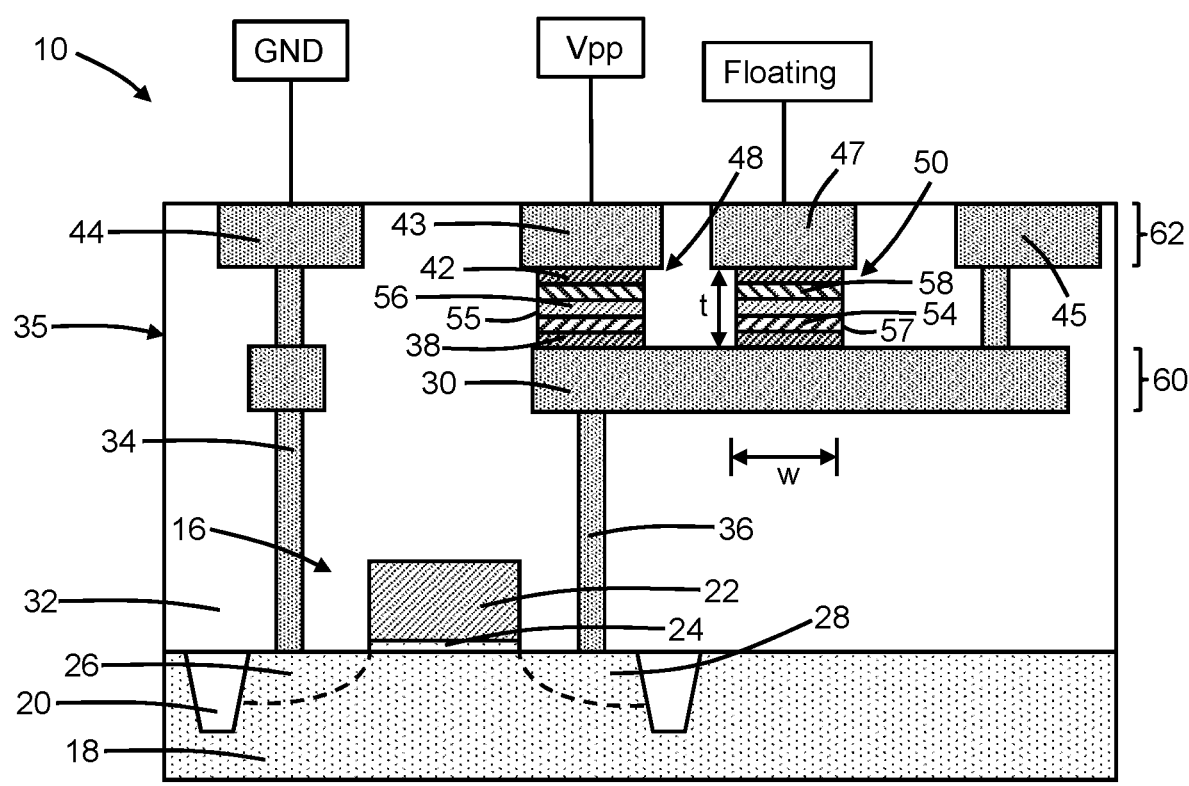
FIG. 3A is a cross-sectional view of the structure of FIG. 3 being programmed in its low-resistance state before use as a temperature sensor.
Figure 3B:
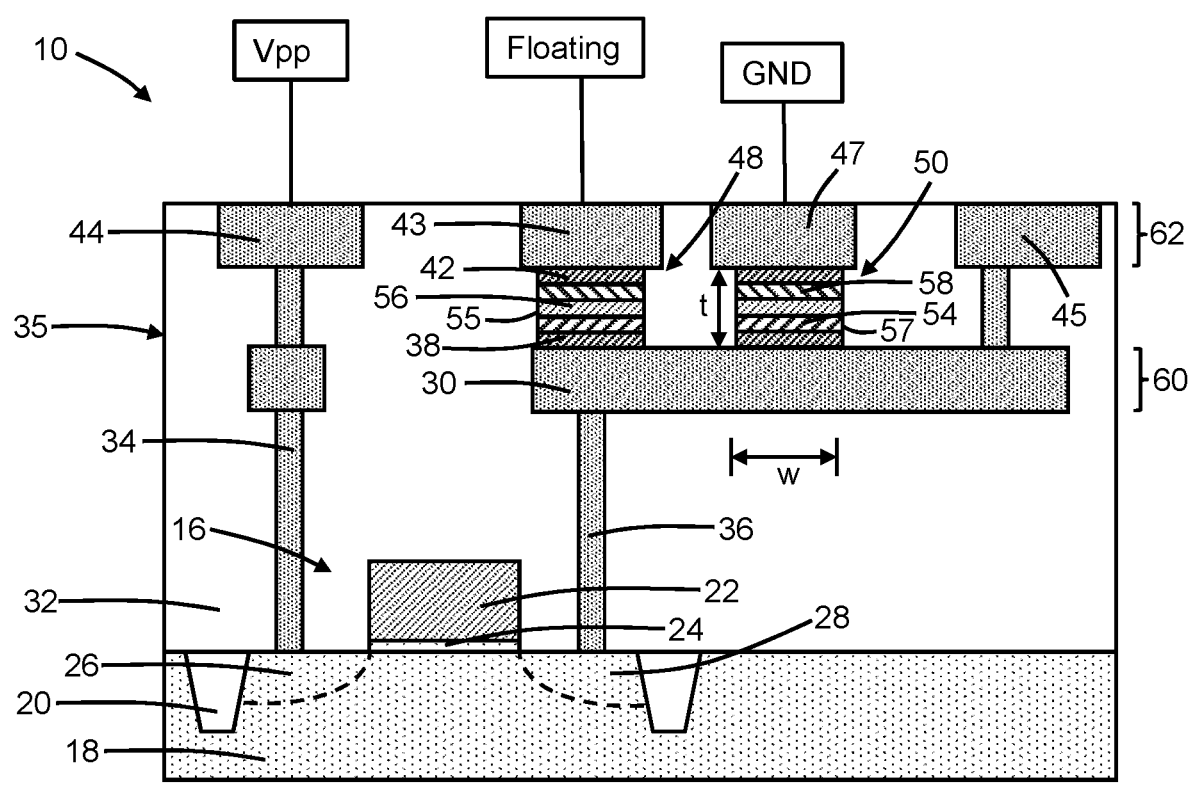
FIG. 3B is a cross-sectional view of the structure of FIG. 3 being programmed in its high-resistance state before use as a temperature sensor.

To prepare the structure 10 to operate as a temperature sensor, the non-volatile memory element 48 is placed in its low-resistance state, as shown in FIG. 3A, by applying a programming voltage (Vpp) to the non-volatile memory element 48, connecting the source line 44 to ground (GND), allowing the non-volatile memory element 50 to float without connection, and turning on the transistor 16 to supply a programming bias. The non-volatile memory element 50 is placed in its high-resistance state, as shown in FIG. 3B, by connecting the non-volatile memory element 50 to ground (GND), applying a programming voltage (Vpp) to the source line 44, allowing non-volatile memory element 48 to float without connection, and turning on the transistor 16 to supply a programming current. After placing the non-volatile memory element 48 in its high-resistance state and the non-volatile memory element 50 in its low-resistance state, the non-volatile memory elements 48, 50 are not further cycled between states.

In use when sensing temperature and with reference to FIG. 3, the voltage source (V1) coupled to the non-volatile memory element 48 may be set to an operating voltage (e.g., 1 volt), the non-volatile memory element 50 may be coupled by the voltage source (V2) to ground, and the field-effect transistor 16 may be turned off. The electrical resistance of the non-volatile memory element 50, which was placed in its high-resistance state, may vary significantly as a function of temperature, whereas the electrical resistance of the non-volatile memory element 48, which was placed in its low-resistance state, is less sensitive to temperature variations.

The tunnel magnetoresistance ratio (TMR), which signifies the sensing margin as a difference of the electrical resistance between the low-resistance and high-resistance states, varies as a function of temperature, which produces a variation in the value of the output voltage (Vout).

The layer stack including the fixed layer 54, the tunnel barrier layer 56, and the free layer 58 (and optionally the bottom and top electrodes 38, 42) of the non-volatile memory element 48 may have a sidewall 55 extending about the layer stack. Similarly, the layer stack including the fixed layer 54, the tunnel barrier layer 56, and the free layer 58 (and optionally the bottom and top electrodes 38, 42) of the non-volatile memory element 50 may have a sidewall 57 extending about the layer stack. The sidewalls 55, 57 may define respective perimeters that have equal dimensions in a horizontal plane to provide the non-volatile memory elements 48, 50 with equal sizes. Alternatively, the sidewalls 55, 57 may have unequal dimensions in the horizontal plane to provide the non-volatile memory elements 48, 50 with unequal sizes. The perimeter dimensions of the layer stacks may be established by the etch mask used during patterning with the photolithography and etching processes. Independent of perimeter dimensions, the layer stacks may have substantially equal thicknesses, t, in a direction normal to the horizontal plane. The electrical resistance of each of the non-volatile memory elements 48, 50 varies with a change in perimeter dimensions. For example, the width dimension of the non-volatile memory element 48 may be less than the width dimension of the non-volatile memory element 50, which will provide the non-volatile memory element 48 with a higher electrical resistance than the non-volatile memory element 50 and increase the temperature sensitivity of the structure 10.

Figure 4:
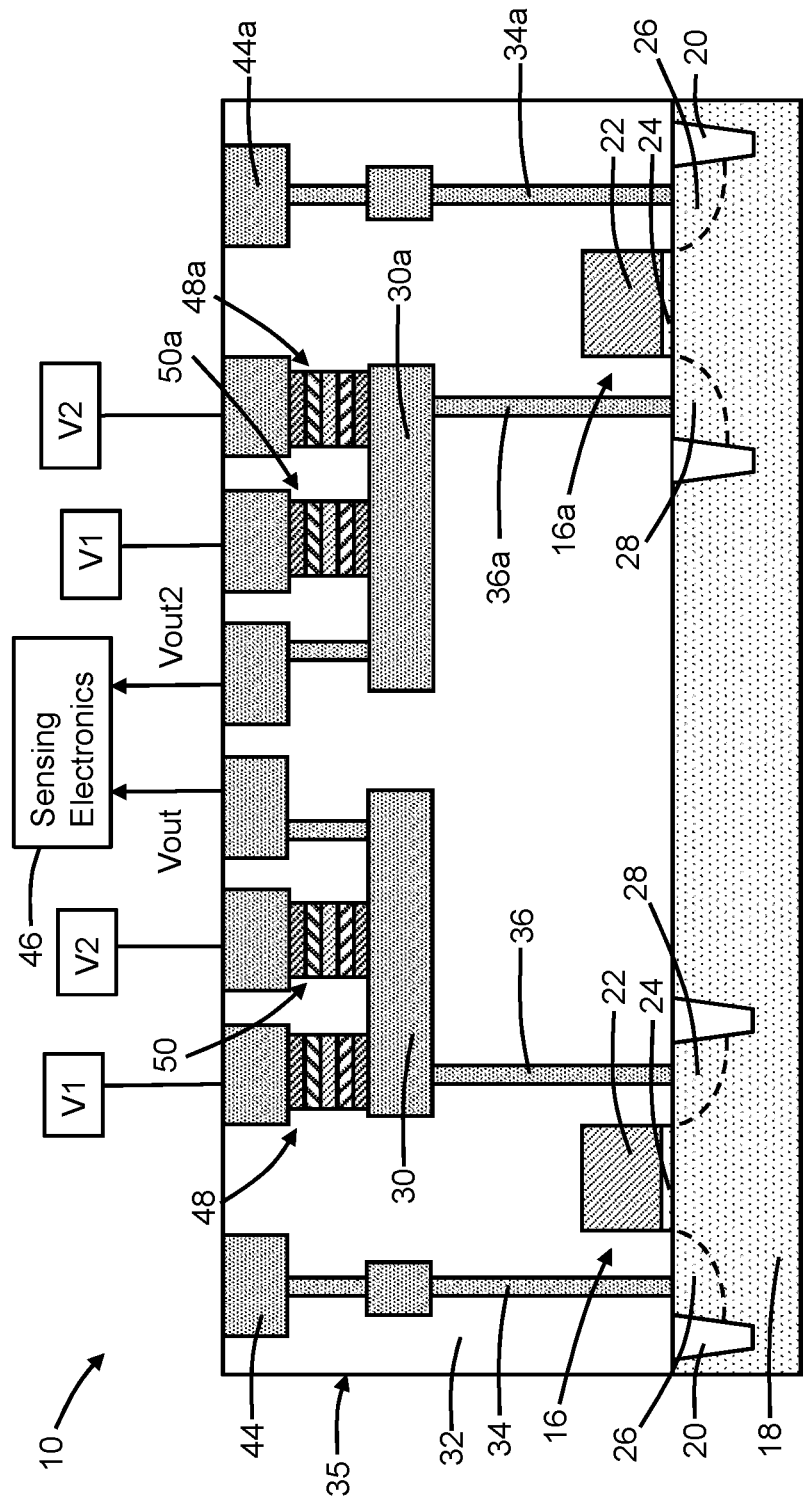
FIG. 4 is a cross-sectional view of a structure for a temperature sensor in accordance with embodiments of the invention.

With reference to FIG. 4 in which like reference numerals refer to like features in FIG. 3 and in accordance with alternative embodiments, the structure 10 for the temperature sensor may be modified to include an additional non-volatile memory element 48a, an additional non-volatile memory element 50a, and an additional field-effect transistor 16a coupled to the non-volatile memory elements 48a, 50a. The non-volatile memory element 48a may be constructed and function identically to the non-volatile memory element 48 as previously described. The non-volatile memory element 50a may be constructed and function identically to the non-volatile memory element 50 as previously described. The field-effect transistor 16a may be constructed and function identically to the field-effect transistor 16 as previously described.

The bottom electrode 38 of both non-volatile memory elements 48a, 50a is coupled by a metal feature 30a similar to metal feature 30 and an interconnection 36a similar to interconnection 36 to the drain region 28 of the field-effect transistor 16a. The top electrode 42 of the non-volatile memory element 48a is coupled to a voltage source (V1). The top electrode 42 of the non-volatile memory element 50a is coupled to the voltage source (V2). A source line 44a similar to source line 44 is coupled by the interconnection 34a to the source region 26 of the field-effect transistor 16a. The metal feature 30a is also coupled to the sensing electronics 46. The gate electrode 22 of the field-effect transistor 16a may function as a word line.

To prepare the structure 10 to operate as a temperature sensor, the non-volatile memory element 48a is placed in its low-resistance state by applying a programming voltage to the non-volatile memory element 48a, connecting the source line 44a to ground, allowing the non-volatile memory element 50a to float without connection, and turning on the transistor 16a to supply a programming bias. The non-volatile memory element 50a is placed in its high-resistance state by connecting the non-volatile memory element 50a to ground (GND), applying a programming voltage (Vpp) to the source line 44a, allowing non-volatile memory element 48a to float without connection, and turning on the transistor 16a to supply a programming current. After placing the non-volatile memory element 48a in its high-resistance state and the non-volatile memory element 50a in its low-resistance state, the non-volatile memory elements 48a, 50a are not further cycled between states.

In use to sense temperature, the voltage source (V2) coupled to the non-volatile memory element 48a may be set to an operating voltage (e.g., 1 volt), the non-volatile memory element 50a may be coupled by the voltage source (V1) to ground, and the field-effect transistor 16 may be turned off. An output voltage (Vout2) is generated by the non-volatile memory elements 48a, 50a and is provided from the metal feature 30a to the sensing electronics 46. The sensing electronics 46 converts the combination of the output voltage (Vout) from the non-volatile memory elements 48, 50 and the output voltage (Vout2) from the non-volatile memory elements 48a, 50a to a temperature reading. The temperature sensitivity of the temperature measurement may be effectively increased (e.g., doubled) by the addition of the non-volatile memory elements 48a, 50a and field-effect transistor 16a to the structure 10. In embodiments, additional sets of memory elements and field-effect transistors may be added to further increase the temperature sensitivity.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   an interconnect structure including one or more interlayer dielectric layers and a first metal feature in the one or more interlayer dielectric layers;
   a voltage source;
   a first non-volatile memory element in the interconnect structure, the first non-volatile memory element including a first bottom electrode positioned on the first metal feature, a first top electrode coupled within the interconnect structure to the voltage source, and a first switching layer between the first bottom electrode and the first top electrode;
   a second non-volatile memory element in the interconnect structure, the second non-volatile memory element including a second bottom electrode positioned on the first metal feature, a second top electrode coupled within the interconnect structure to ground, and a second switching layer between the second bottom electrode and the second top electrode; and
   temperature sensing electronics coupled by the first metal feature to the first bottom electrode of the first non-volatile memory element and the second bottom electrode of the second non-volatile memory element.

2. The structure of claim 1 wherein the first non-volatile memory element and the second non-volatile memory element are resistive memory elements.

3. The structure of claim 2 wherein the first non-volatile memory element has a first electrical resistance, and the second non-volatile memory element has a second electrical resistance that is less than the first electrical resistance.

4. The structure of claim 2 wherein the first non-volatile memory element has a first electrical resistance with a first temperature dependence, and the second non-volatile memory element has a second electrical resistance with a second temperature dependence that exhibits a greater variation with increasing temperature than the first temperature dependence.

5. The structure of claim 1 wherein the first non-volatile memory element and the second non-volatile memory element each have an unprogrammed state when fabricated, a low-resistance state when programmed, or a high-resistance state when programmed, the first non-volatile memory element has the high-resistance state, and the second non-volatile memory element is in the unprogrammed state with a resistance different from either a resistance of the low-resistance state or a resistance of the high-resistance state.

6. The structure of claim 1 wherein the first non-volatile memory element and the second non-volatile memory element each have either a low-resistance state or a high-resistance state when programmed, the first non-volatile memory element has the high-resistance state, and the second non-volatile memory element has the low-resistance state.

7. The structure of claim 1 further comprising:
   a field-effect transistor including a drain that is coupled to the first metal feature.

8. The structure of claim 1 further comprising:
   a third non-volatile memory element; and
   a fourth non-volatile memory element,
   wherein the first non-volatile memory element and the second non-volatile memory element are independently coupled to the temperature sensing electronics.

9. The structure of claim 8 wherein the interconnect structure includes a second metal feature in the one or more interlayer dielectric layers, and the third non-volatile memory element and the fourth non-volatile memory element each include an electrode disposed on the second metal feature.

10. A method comprising:
    forming a first non-volatile memory element and a second non-volatile memory element on a first metal feature positioned in one or more dielectric layers of an interconnect structure,
    wherein the first non-volatile memory element includes a first bottom electrode positioned on the first metal feature, a first top electrode coupled within the interconnect structure to a voltage source, and a first switching layer between the first bottom electrode and the first top electrode, and the second non-volatile memory element includes a second bottom electrode positioned on the first metal feature, a second top electrode coupled within the interconnect structure to ground, and a second switching layer between the second bottom electrode and the second top electrode, and the first metal feature couples the first bottom electrode of the first non-volatile memory element and the second bottom electrode of the second non-volatile memory element with temperature sensing electronics.

11. The method of claim 10 further comprising:
    forming a third non-volatile memory element and a fourth non-volatile memory element disposed on a second metal feature in the one or more dielectric layers of the interconnect structure,
    wherein the third non-volatile memory element and the fourth non-volatile memory element are coupled by the second metal feature to the temperature sensing electronics.

12. The method of claim 10 wherein the first non-volatile memory element has a first electrical resistance with a first temperature dependence, and the second non-volatile memory element has a second electrical resistance with a second temperature dependence that exhibits a greater variation with increasing temperature than the first temperature dependence.

13. The method of claim 10 wherein the first non-volatile memory element and the second non-volatile memory element each have either an unprogrammed state when fabricated, a low-resistance state when programmed, or a high-resistance state when programmed, the first non-volatile memory element has the high-resistance state, and the second non-volatile memory element is in the unprogrammed state with a resistance different from does not have either a resistance of the low-resistance state or a resistance of the high-resistance state.

* * * * *